US011664908B2

(12) United States Patent
Gallhauser et al.

(10) Patent No.: US 11,664,908 B2
(45) Date of Patent: May 30, 2023

(54) OVER-THE-AIR TEST MODULE AND TEST SYSTEM

(71) Applicant: Rohde & Schwarz GmbH & Co. KG, Munich (DE)

(72) Inventors: Markus Gallhauser, Munich (DE); Nino Voss, Munich (DE); Werner Perndl, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 34 days.

(21) Appl. No.: 17/531,344

(22) Filed: Nov. 19, 2021

(65) Prior Publication Data

US 2022/0216927 A1 Jul. 7, 2022

(30) Foreign Application Priority Data

Jan. 5, 2021 (EP) ..................................... 21150211

(51) Int. Cl.
*H04B 17/00* (2015.01)
*H04B 17/14* (2015.01)
*H04B 17/23* (2015.01)

(52) U.S. Cl.
CPC ............. *H04B 17/14* (2015.01); *H04B 17/23* (2015.01)

(58) Field of Classification Search
CPC ........ H04B 17/14; H04B 17/23; H04B 17/11; H04B 17/21; H04B 17/24
See application file for complete search history.

(56) References Cited

U.S. PATENT DOCUMENTS

| 10,056,987 | B1 | 8/2018 | Gallhauser et al. |
| 10,345,421 | B2 * | 7/2019 | Leibfritz .......... G06K 19/06009 |
| 10,693,572 | B2 | 6/2020 | Gallhauser et al. |
| 2012/0225624 | A1 * | 9/2012 | Kyosti ................. H01Q 3/2605 455/67.11 |
| 2013/0331042 | A1 | 12/2013 | See et al. |
| 2014/0329472 | A1 | 11/2014 | Kovacs et al. |
| 2016/0301588 | A1 * | 10/2016 | Olgaard .................. H04L 43/50 |
| 2017/0222737 | A1 | 8/2017 | Perndl et al. |
| 2019/0391194 | A1 | 12/2019 | Gallhauser et al. |

FOREIGN PATENT DOCUMENTS

| EP | 3264641 A1 | 1/2018 |
| EP | 3608679 A1 | 2/2020 |

* cited by examiner

*Primary Examiner* — Tuan Pham

(74) *Attorney, Agent, or Firm* — Christensen O'Connor Johnson Kindness PLLC

(57) ABSTRACT

The present disclosure relates to an over-the-air test apparatus for testing a device under test over-the-air. The test apparatus includes an antenna that is connected with a radio frequency circuit having at least three ports. A first port of the radio frequency circuit is connected with a first path that includes a connector configured to connect a signal analyzer and/or a signal generator with the over-the-air test circuit. A second port of the radio frequency circuit is connected with a second path that encompasses a detector. The second path includes an interface configured to be connected with a power meter, a signal analyzer or a feedback interface of a signal generator. Further, a test system is described.

18 Claims, 1 Drawing Sheet

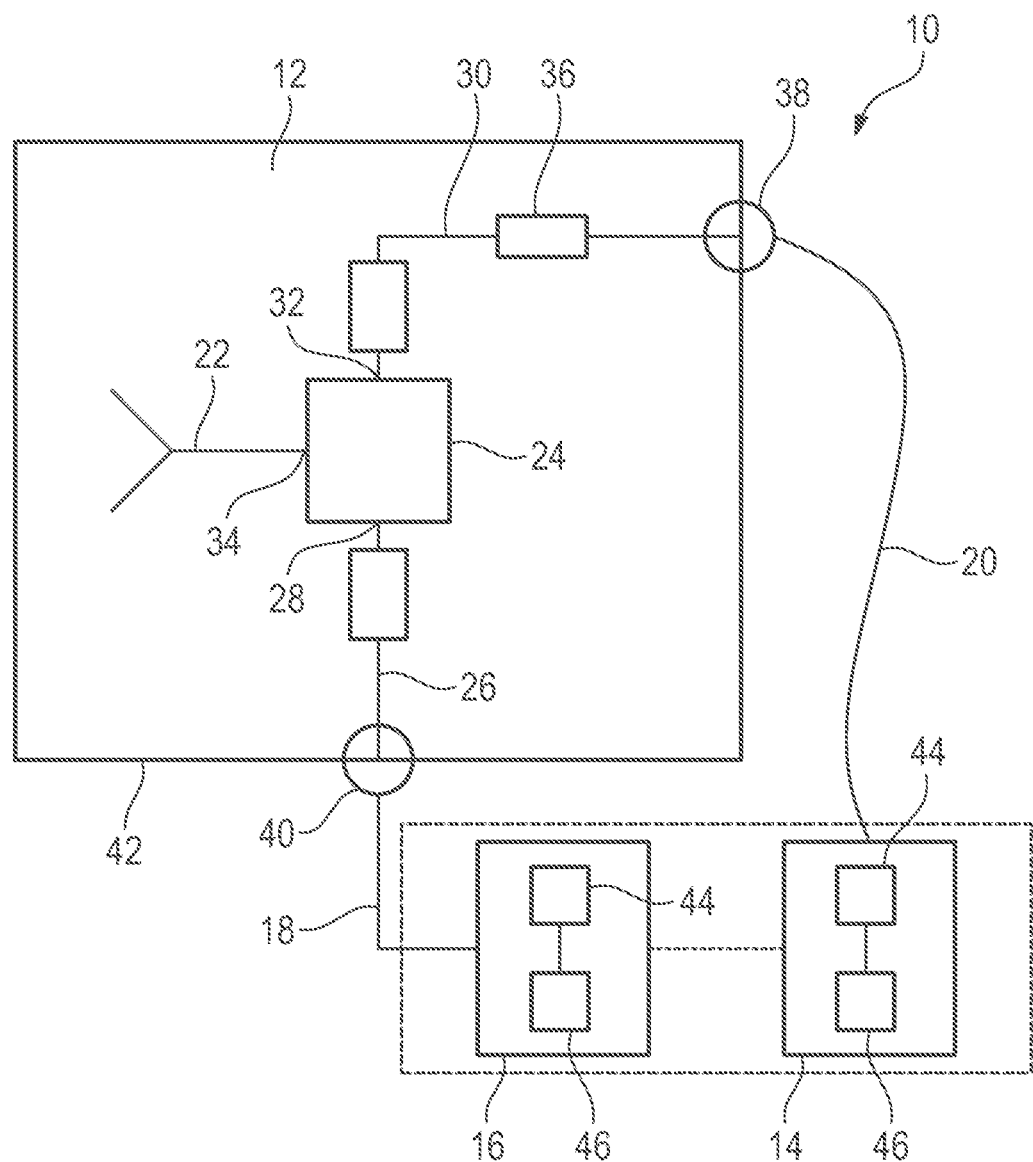

OVER-THE-AIR TEST MODULE AND TEST SYSTEM

FIELD OF THE DISCLOSURE

Embodiments of the present disclosure relate to an over-the-air test module for testing a device under test over-the-air. Further, embodiments of the present disclosure relate to a test system for testing a device under test over-the-air.

BACKGROUND

In the state of the art, test systems are known that are used for testing a device under test (DUT) over-the-air (OTA). The test systems typically comprise a signal generator and/or a signal analyzer, which depends on the respective testing purpose of the device under test. The signal generator or the signal analyzer relate to a test device that is used to test the device under test with regard to its transmission or rather reception characteristics.

The respective device has at least one port with which an antenna is connected for testing the device under test over-the-air (OTA), namely in a wireless manner At the beginning, a reference plane of the respective test setup, namely the OTA setup, is associated with the port of the test device since the test device is a calibrated one. Generally, the reference plane exists at the point where calibration was performed, but if needed, the reference plane can be extended. For testing the device under test over-the-air, the test device is connected with the antenna via a cable, thereby establishing the OTA setup that has not been calibrated accordingly. Therefore, the reference plane shall be extended to the antenna for ensuring proper testing of the device under test. For extending the reference plane to the antenna, it is thus necessary to manually calibrate the OTA setup appropriately, namely after connecting the antenna with the test device.

However, the manual calibration is complex and time-consuming Further, the manual calibration is prone to failure such that the calibration is done in an improper manner, yielding inappropriate measurement results when testing the device under test by means of the test system.

Accordingly, there is a need for a cost-efficient and simple way to provide an over-the-air setup for testing a device under test over-the-air.

SUMMARY

Embodiments of the present disclosure provide an over-the-air testing apparatus or module for testing a device under test over-the-air. In an embodiment, the test module comprises an antenna that is connected with a radio frequency circuit or module having at least three ports. A first port of the radio frequency module is connected with a first path that comprises a connector configured to connect a signal analyzer and/or a signal generator with the over-the-air test module. A second port of the radio frequency module is connected with a second path that encompasses a detector circuit or module. The second path comprises an interface configured to be connected with a power meter, a signal analyzer or a feedback interface of a signal generator.

The main idea is to provide a pre-calibrated over-the-air (OTA) test module that can be connected with at least one test device easily, for instance a signal generator, a signal analyzer and/or a power meter. This ensures that it is not necessary to manually calibrate the over-the-air setup for testing the device under test, as the OTA test module can be calibrated already by the manufacturer or rather at the works. Hence, the reference plane of the over-the-air setup can be extended automatically to the antenna from the respective port of the test device connected with the test module since the test module is pre-calibrated. Accordingly, the reference plane is automatically extended, e.g., without any manual calibration, to the point of the OTA setup that is as close as possible to the device under test, namely the antenna.

In some embodiments, the over-the-air test module is a small and cost-efficient module that provides a plug and play solution. Accordingly, a customer only has to connect the over-the-air test module with the at least one test device, namely the power meter, the signal generator, the signal analyzer or a combined signal generator and analyzer. For this purpose, the over-the-air test module comprises the connector as well as the interface.

The additional and integrated detector module provides an additional monitoring purpose of the signal processed by the test module, namely the radio frequency signal. In some embodiments, the detector module is adapted for deriving a measurement signal from the signal processed by the test module, namely a radio frequency or rather high frequency signal. For instance, the detector module may be established by a diode sensor, which is configured to perform a rectification of a signal derived from the radio frequency signal.

Since the detector module is located within the second path that ends at the interface, the signal derived from the signal processed by the test module, namely the measurement signal, can be outputted via the interface for further analyzing purposes. The respective measurement signal provided by the detector module may be forwarded to the power meter, the signal analyzer or the feedback interface, which is connected with the second path via the interface.

Generally, the signal generator differs from a local oscillator that is be used together with a mixer to change a frequency of a signal, e.g., a signal generated. Put differently, the signal generator is configured to generate the signal to be transmitted for testing the device under test, e.g., a radio frequency signal. On the other hand, a local oscillator is different compared to the signal generator, as the local oscillator is not enabled to generate a radio frequency signal.

An aspect provides that the test module is an integrated module having a housing that encompasses the radio frequency module, the first path, the second path and the detector module. In some embodiments, the housing also encompasses the antenna. Hence, the antenna is an integrated antenna. The connector and/or the interface may be established at an outer surface of the housing of the test module. Generally, the respective connections or rather lines established between the internal components of the test module are fixed ones such that stable and consistent characteristics of the test module can be ensured when performing tests.

Another aspect provides that the connector is a radio frequency connector and/or the interface is a radio frequency interface. The test module is used for processing radio frequency signals that are to be transmitted by the antenna and/or received by the antenna. Hence, the radio frequency signals are forwarded to the antenna from the test device or rather forwarded from the antenna to the respective test device connected with the test module.

In some embodiments, the radio frequency connector and/or the radio frequency interface are/is established by a coaxial port. The coaxial port ensures that the test module can be connected easily with the respective test device via a coaxial cable. Usually, the respective port of the test device is also established by a coaxial port.

For instance, the connector and/or the interface are/is reconnectable. This means that the connection established via the connector and/or the interface can be solved and re-connected easily. For instance, the connector and/or the interface relate to socket(s) configured to receive a plug, for example a plug-like end of a cable.

Therefore, the test module may be used in different operational settings or rather operation modes, namely different OTA setups, in which different characteristics of the device under test can be tested.

For instance, the connector of the test module may be connected with a first test device in a first setup, whereas the connector of the test module is connected with another test device in a second setup. This can be ensured due to the fact that the connector is reconnectable. The same applies for the interface that can be connected with different test devices as well.

A further aspect provides that the radio frequency circuit or module is a coupler, for example directional coupler. For instance, the radio frequency module is established by a splitter, a divider or a combiner. Generally, the radio frequency module can be used to split or rather divide a radio frequency signal received via the antenna that has been forwarded from the antenna to the radio frequency module. However, the radio frequency module may also be established by a combiner in order to combine signals received via both paths, for example received via the connector and the interface. Then, the combined signal is forwarded from the radio frequency module to the antenna for being transmitted towards the device under test.

In general, the first path and/or the second path may be a bidirectional path that ensures signal processing in both directions. Therefore, the test module can be used for testing receiving properties of the device under test as well as transmitting properties of the device under test since the same paths, namely the first path and/or the second path, can be used for forwarding the respective signal to the antenna or rather from the antenna. The processing direction depends on the operation mode or rather the testing purpose.

Embodiments of the present disclosure also provide a test system for testing a device under test over-the-air. In an embodiment, the test system comprises any of the example over-the-air test modules mentioned above as well as a power meter, a signal analyzer and/or a signal generator. Accordingly, the test system comprises separately formed devices that may be connected with the test module. The power meter may also be integrated within the signal generator and/or signal analyzer.

An aspect provides that the test system has a first operational setting, in which a signal received via the antenna is forwarded via the radio frequency module to the first path and the second path, for example simultaneously. Thus, the radio frequency module may be established by a splitter or a divider that splits/divides the radio frequency signal received into two signals that are processed by both paths such that the split/divided signals are forwarded to the connector and the interface. The respective test device connected with the interface or rather the connector may be used for measuring or rather analyzing the respective signal received.

For instance, the test system has a first operation mode in which the power meter is connected with the interface and the signal analyzer is connected with the connector. In this operation mode, the power of the signal received can be measured (by the separately formed power meter) and the signal can be analyzed simultaneously, for instance its spectrum. The (separately formed) power meter may be connected with the signal analyzer via a cable connection. Alternatively, the power meter may also be integrated within the signal analyzer. Then, the signal analyzer is connected with both the connector and the interface.

The test system may have a second operation mode in which the power meter is connected with the interface and the signal generator is connected with the connector. The signal generator may generate a signal to be transmitted via the antenna that is forwarded to the antenna via the radio frequency module. The power meter may measure a reflected signal (portion), thereby determining a matching of the entire over-the-air setup, or rather a response signal. The (separately formed) power meter may be connected with the signal generator via a cable connection. Alternatively, the power meter may also be integrated within the signal generator. Then, the signal generator is connected with both the connector and the interface.

Another aspect provides that the test system has a third operation mode in which the feedback interface of the signal generator is connected with the interface and the signal generator is connected with the connector. Thus, the signal generator generates a signal that is forwarded to the antenna via the radio frequency module for being transmitted, wherein the signal generator receives a feedback via its feedback interface that is connected with the interface of the test module. The feedback signal may be used for controlling the signal generator accordingly, for example in an automatic manner Further, the test system may have a fourth operation mode in which the signal analyzer is connected with the interface and the signal generator is connected with the connector. Hence, a signal can be generated by the signal generator that is used for testing the device under test, for example its receiving properties. Simultaneously, the signal analyzer connected with the interface can be used for analyzing the device under test, for example with regard to its transmission properties.

The test system may comprise a combined signal generator and analyzer. The combined signal generator and analyzer encompasses the signal generator and the signal analyzer within a single housing. The interface and the connector of the test module may be connected with the combined signal generator and analyzer. Therefore, the test module may be connected with a single separately formed test device that is established by the combined signal generator and analyzer.

The test system may have a second operational setting in which a signal to be transmitted via the antenna is combined via the radio frequency module that receives two signals via the first path and the second path. The signals are combined via the radio frequency module, thereby obtaining a combined signal that is forwarded to the antenna for being transmitted towards the device under test.

The signal analyzer and/or the signal generator may have a display and a processing circuit. The processing circuit is configured to calculate a field strength based on information received from the test module, for example the detection module. The display is configured to indicate the field strength calculated. Accordingly, an operator of the test system can be informed with regard to the field strength such that information is obtained for characterizing the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 schematically shows a representative test system according to an embodiment of the present disclosure that comprises an embodiment of a test module according to the present disclosure.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

As used herein, the term "module" may refer to or include, inter alia, a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon.

In an embodiment, the circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, the circuitry includes hardware circuit implementations (e.g., implementations in analog circuitry, implementations in digital circuitry, and the like, and combinations thereof). In an embodiment, the circuitry includes combinations of circuits and computer program products having software or firmware instructions stored on one or more computer readable memories that work together to cause a device to perform one or more protocols, methodologies or technologies described herein. In an embodiment, the circuitry includes circuits, such as, for example, microprocessors or portions of microprocessor, that require software, firmware, and the like for operation to cause a device to perform one or more protocols, methodologies or technologies described herein. In an embodiment, the circuitry includes an implementation comprising one or more processors or portions thereof and accompanying software, firmware, hardware, and the like, thereby forming a special purpose computer or machine that performs one or more protocols, methodologies or technologies described herein.

In FIG. 1 a test system 10 is shown that comprises a test module 12 as well as two separately formed test devices 14, 16 that are connected with the test module 12 via cables 18, 20. As will be described in more detail below, the test module 12 may comprise a housing that houses a number of circuits for carrying out the functionally set forth herein.

In the embodiment illustrated in FIG. 1, the test module 12 is an integrated module that comprises an antenna 22 and a radio frequency module 24 comprising one or more circuits. The radio frequency module 24 is connected with a first path 26 via a first port 28 as well as with a second path 30 via a second port 32. The radio frequency module 24 also has a third port 34 via which the radio frequency module 24 is connected with the antenna 22.

In the paths 26, 30, additional signal processing elements like resistors may be provided. In the second path 30, a detector, such as a detector circuit or module 36 is provided. In some embodiments, the detector module 36 may be established by or include a diode sensor that is configured to perform a rectification of a signal derived from the radio frequency signal. Thus, the detector module 36 can be used to sense properties of an environment impact on the antenna 22.

The second path 30 may also comprises an interface 38 that is configured to be connected with a first of the two test devices 14, 16 with the over-the-air test module 12, namely the first test device 14. The first test device 14 may be a power meter, a signal analyzer or a feedback interface, for instance a feedback interface of a signal generator. In an embodiment, the power meter, the signal analyzer, the signal generator, and/or a feedback interface includes one or more circuits for carrying out the respective functionality.

The first path 26 comprises a connector 40 that is configured to connect a second of the two test devices 14, 16 with the over-the-air test module 12, namely the second test device 16. The second test device 16 may be established by a signal analyzer or a signal generator.

Alternatively, the power meter may be integrated within the signal analyzer or the signal generator such that a single separately formed device is connected with the test module 12 via the connector 40 and the interface 38 as indicated by the dashed lines in FIG. 1.

In a similar manner, the feedback interface, for example the one of the signal generator, may be provided at the signal generator that is connected with the OTA test module 12 via the connector 40 such that the single signal generator is connected with the test module 12 via both the connector 40 and the interface 38.

Moreover, a combined signal analyzer and generator (also shown by the dashed lines) may be provided that is a single device which is connected with the connector 40 and the interface 38 simultaneously.

As shown in FIG. 1, the test module 12 has its own housing 42 that encompasses the radio frequency module 24, the first path 26, the second path 30 and the detector module 36 as well as the antenna 22. Thus, the entire test module 12 is integrated and can be pre-calibrated by its manufacturer, namely at the works.

Depending on the respective testing purposes, the radio frequency module 24, in some embodiments, may be or include a splitter, a divider or a combiner. Hence, the radio frequency module 24 may be established by or include a coupler, for example a directional coupler.

Thus, the respective radio frequency module 24 may be operated in both directions such that it can be used for splitting/dividing a radio frequency signal received via the antenna 22 or combining signals received via both paths 26, 30, thereby obtaining a combined signal to be forwarded to the antenna 22 for being transmitted. Accordingly, the first path 26 and/or the second path 30 are/is established as a bidirectional path such that signals can be processed in both directions along the path(s) 26, 30.

Since the test module 12 can be used in different operational settings or operation modes of the test system 10, the respective connector 40 and the interface 38 are reconnectable ones, thereby ensuring that different test devices 14, 16 can be connected with the respective connector 40 and interface 38 appropriately, as described above.

In some embodiments, the connector 40 as well as the interface 38 are established by or include a coaxial port. This ensures that the respective test module 12 can be connected easily with different test devices 14, 16 that typically comprise a coaxial port as well. Hence, the test module 12 and the test device(s) 14, 16 can be connected with each other by coaxial cables.

Moreover, the connector 40 may be a radio frequency connector. The interface 38 may also be established by or include a radio frequency interface. Hence, radio frequency signals can be forwarded to the test module 12 or received from the test module 12 via the connector 40 and the interface 38 appropriately. In an embodiment, the radio frequency interface includes one or more RF circuits.

Accordingly, the test system 10 may have first operational setting, in which a signal received via the antenna 22 is forwarded via the radio frequency module 24 operated as a splitter or rather divider to the first path 26 and the second path 30. Via the first path 26, the respective split/divided signal is forwarded to the connector 40. Via the second path 30, the respective split/divided signal is forwarded to the detection module 36 that processes the respective signal, namely the split/divided radio frequency signal, thereby deriving a measurement signal that is forwarded to the interface 38.

Via the connector 40 and the interface 38, the first and second test devices 14, 16 connected receive the respective signals for further processing.

Moreover, the test system 10 has a second operational setting, in which a signal to be transmitted via the antenna 22 is combined via the radio frequency module 24 that receives two signals via the first path 26 and the second path 30. The respective signals to be combined by the radio frequency module 24 are forwarded to the test module 12 via the interface 38 and the connector 40.

Generally, the test system 10 has several different operation modes that depend on the respective test device(s) 14, 16 connected with the connector 40 and the interface 38 of the test module 12, respectively.

In a first operation mode, a power meter is connected with the interface 38 and a signal analyzer is connected with the connector 40.

In a second operation mode, a power meter is connected with the interface 38 and a signal generator is connected with the connector 40.

In a third operation mode, a feedback interface of the signal generator is connected with the interface 38 and the signal generator is connected with the connector 40.

In a fourth operation mode, a signal analyzer is connected with the interface 38 and a signal generator is connected with the connector 40.

In general, the signal analyzer and/or the signal generator, namely the respective test devices 14, 16, may have a display 44 as well as a processing circuit 46, for example an integrated processing circuit, an integrated circuit, etc.

In some embodiments, the processing circuit 46 is configured to calculate a field strength based on information received from the test module 12, wherein the display 44 is connected with the processing circuit 46 and is configured to indicate (e.g., display) the field strength calculated by the processing circuit 46. Therefore, an operator of the test system 10 is informed concerning the field strength in order to obtain information concerning the characteristics of the device under test.

In some embodiments, the test module 12 provides a pre-calibrated module that has pre-determined connections between its internal components, thereby ensuring that an operator/consumer can easily connect the test module 12 with the respective test devices 14, 16 for establishing the test system 10, namely the over-the-air setup that is used for testing the device under test.

The reference plane is extended from the port of the respective test device 14, 16 to the antenna 22 of the test module 12 since the test module 12 is pre-calibrated. Therefore, it is not necessary that the operator of the test system 10 has to perform a manual calibration in order to extend the reference plane, thereby reducing efforts and time required for testing a device under test, which in return saves costs.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

It should be noted that for purposes of this disclosure, terminology such as "upper," "lower," "vertical," "horizontal," "fore," "aft," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. An over-the-air test apparatus for testing a device under test over-the-air, comprising: an antenna that is connected with a radio frequency module having at least three ports, wherein a first port of the radio frequency module is connected with a first path that comprises a connector configured to connect a signal analyzer and/or a signal generator with the over-the-air test apparatus, wherein a second port of the radio frequency module is connected with a second path that encompasses a detector, and wherein the second path comprises an interface configured to be connected with a power meter, a signal analyzer or a feedback interface of a signal generator.

2. The over-the-air test apparatus according to claim 1, wherein the test apparatus is an integrated module having a housing that encompasses the radio frequency module, the first path, the second path and the detector.

3. The over-the-air test apparatus according to claim 2, wherein the housing also encompasses the antenna.

4. The over-the-air test apparatus according to claim 1, wherein the connector is a radio frequency connector and/or wherein the interface is a radio frequency interface.

5. The over-the-air test apparatus according to claim 4, wherein the radio frequency connector and/or the radio frequency interface are/is established by a coaxial port.

6. The over-the-air test apparatus according to claim 1, wherein the connector and/or the interface are/is reconnectable.

7. The over-the-air test apparatus according to claim 1, wherein the radio frequency module includes a coupler, a splitter, a divider or a combiner.

8. The over-the-air test apparatus according to claim 1, wherein the first path and/or the second path are/is a bidirectional path that ensures signal processing in both directions.

9. A test system for testing a device under test over-the-air, wherein the test system comprises the over-the-air test apparatus according to claim 1 and a power meter, a signal analyzer and/or a signal generator.

10. The test system according to claim 9, wherein the test system has a first operational setting, in which a signal received via the antenna is forwarded via the radio frequency module to the first path and the second path.

11. The test system according to claim 9, wherein the test system has a first operation mode in which the power meter is connected with the interface and the signal analyzer is connected with the connector.

12. The test system according to claim 9, wherein the test system has a second operation mode in which the power meter is connected with the interface and the signal generator is connected with the connector.

13. The test system according to claim 9, wherein the test system has a third operation mode in which the feedback interface of the signal generator is connected with the interface and the signal generator is connected with the connector.

14. The test system according to claim 9, wherein the test system has a fourth operation mode in which the signal analyzer is connected with the interface and the signal generator is connected with the connector.

15. The test system according to claim 9, wherein the test system comprises a combined signal generator and analyzer.

16. The test system according to claim 15, wherein the interface and the connector are connected with the combined signal generator and analyzer.

17. The test system according to claim 9, wherein the test system has a second operational setting, in which a signal to be transmitted via the antenna is combined via the radio frequency module that receives two signals via the first path and the second path.

18. The test system according to claim 9, wherein the signal analyzer and/or the signal generator have/has a display and a processing circuit, wherein the processing circuit is configured to calculate a field strength based on information received from the test apparatus, and wherein the display is configured to indicate the calculated field strength.

* * * * *